US006225662B1

(12) United States Patent
Blanchard

(10) Patent No.: US 6,225,662 B1
(45) Date of Patent: *May 1, 2001

(54) SEMICONDUCTOR STRUCTURE WITH HEAVILY DOPED BURIED BREAKDOWN REGION

(75) Inventor: Richard Austin Blanchard, Los Altos, CA (US)

(73) Assignee: Philips Semiconductors, Inc., Tarrytown, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/123,596

(22) Filed: Jul. 28, 1998

(51) Int. Cl.⁷ .......................... H01L 29/76; H01L 29/94; H01L 31/062; H01L 31/113; H01L 31/119
(52) U.S. Cl. ............................. 257/345; 257/408
(58) Field of Search ..................... 257/565, 285, 257/318, 409, 376, 372, 345, 408

(56) References Cited

U.S. PATENT DOCUMENTS

| | | | |
|---|---|---|---|
| 5,160,996 | * 11/1992 | Odanaka | 257/375 |
| 5,218,228 | * 6/1993 | Williams et al. | 257/593 |
| 5,262,664 | * 11/1993 | Jung-Suk | 257/344 |
| 5,359,221 | * 10/1994 | Miyamoto et al. | 257/408 |
| 5,395,773 | 3/1995 | Ravindhran . | |
| 5,444,008 | 8/1995 | Han . | |
| 5,512,770 | * 4/1996 | Hong | 257/345 |
| 5,529,941 | 6/1996 | Huang . | |
| 5,567,978 | 10/1996 | Pearce . | |
| 5,578,855 | 11/1996 | Gaffur . | |
| 5,595,921 | 1/1997 | Villa . | |
| 5,605,849 | 2/1997 | Chen . | |
| 5,623,154 | * 4/1997 | Murakami et al. | 257/345 |
| 5,654,225 | 8/1997 | Zambrano . | |
| 5,668,397 | 9/1997 | Davis . | |
| 5,672,897 | 9/1997 | Wantanabe . | |
| 5,681,766 | 10/1997 | Tserng . | |
| 5,691,560 | * 11/1997 | Sakakibara | 257/316 |
| 5,698,459 | 12/1997 | Grubisich . | |
| 5,698,869 | 12/1997 | Yoshimi . | |
| 5,703,520 | 12/1997 | Dikeman . | |
| 5,753,561 | 5/1998 | Lee . | |

FOREIGN PATENT DOCUMENTS 4-43678 * 2/1992 (JP) ...................................... 257/409

OTHER PUBLICATIONS

Wolf et al., Silicon Processing for the VLSI Era vol. 1: Process Technology, Lattice Press, pp. 290, 325, 1986.*

* cited by examiner

Primary Examiner—Steven Loke
Assistant Examiner—Thien F. Tran
(74) Attorney, Agent, or Firm—Crawford PLLC

(57) ABSTRACT

A semiconductor structure with a heavily doped buried breakdown region and a method for manufacture. A source region is disposed in a substrate and is doped with dopant of a type opposite that of the substrate. A drain region is disposed in the substrate at the surface and doped with dopant which is the same as that of the source region, and a gate structure is disposed on the substrate between the source and drain regions. A breakdown region is disposed in the substrate below the drain region and is heavily doped with dopant of a type opposite that of the drain region in order to control the value and location of breakdown.

3 Claims, 5 Drawing Sheets

SEMICONDUCTOR STRUCTURE WITH HEAVILY DOPED BURIED BREAKDOWN REGION

FIELD OF THE INVENTION

The present invention is directed generally to semiconductor structures, and more particularly, to a semiconductor structure having a localized heavily doped buried region to control the location of a breakdown voltage, or having a heavily doped buried region that in part, surrounds a device, thereby preventing latch-up or serving as a collector region.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such siliconbased semiconductor device is a metal-oxide-semiconductor (MOS) transistor.

The principal elements of a typical MOS semiconductor device are illustrated in FIG. 1. The device 100 generally includes a gate electrode 103 of doped polycrystalline silicon, which acts as a conductor, to which an input signal is typically applied via a gate terminal 104. Heavily doped source and drain regions 105 and 106 are formed in a semiconductor substrate 101 and are respectively connected to source and drain terminals 107 and 108. A channel region 109 is formed in the semiconductor substrate 101, which is often referred to as the body region of the transistor, beneath the gate electrode 103 that separates the source and drain regions 105 and 106 when the appropriate voltage is applied to the gate. The body region is typically lightly doped with a dopant type opposite to that of the source/drain regions 105. The gate electrode 103 is physically separated from the semiconductor substrate 101 by a gate insulating layer 110, typically an oxide layer such as $SiO_2$. The insulating layer 110 is provided to prevent current from flowing between the gate electrode 103 and the source and drain regions 105 and 106, the body region 101, or the channel region 109. A body contact region 112 that is heavily doped with a dopant opposite that of the source and drain regions 105 and 106 is also formed to connect the body region to a voltage. The body contact region 112 is connected to a grounded body terminal 114, for example.

In operation, an output voltage is typically developed between the source and drain terminals 107 and 108. When the correct input voltage is applied to the gate electrode 103, the electric field below the gate 103 induces the channel region 109. By varying the voltage on the gate 103, and hence the electric field, it is possible to modulate the conductance of the channel region 109 between the source and drain regions 105 and 106. In this manner an electric field controls the current flow through the channel region 109. This type of device is commonly referred to as a MOS field-effect-transistor (MOSFET).

The ability of both n-channel and p-channel MOSFETs to withstand over-voltage conditions is important for device reliability. MOSFETs connected to input or output pads are most likely to experience an over-voltage condition. If the drain-to-source breakdown voltage ($BV_{dss}$) of a MOS transistor is exceeded, the resulting current flow may damage or destroy the device. In FIG. 1, the drain is reverse biased and the resulting depletion region 120 extends under the gate 103.

Damage can be caused by breakdown occurring at or near the surface of the transistor. The device can be damaged in two ways. First, energetic electrons and holes that are generated when breakdown occurs can be injected into the dielectrics in the vicinity of the drain-to-body junction, particularly the gate dielectric 110, thereby changing the apparent threshold voltage of the MOSFET. The change in apparent threshold voltage can result in a higher current flow for the same applied gate voltage, which can destroy a transistor if the reduction in the apparent threshold voltage is sufficiently large. Second, heat that is generated near the surface as a result of the localized power dissipation can alter the characteristics of the materials in the area, for example, silicon, metals, and dielectrics. Increased conductivity can result and change the performance of the MOSFET.

Therefore, a semiconductor structure that addresses the above identified problems associated with drain-to-body breakdown is desirable.

SUMMARY OF THE INVENTION

A semiconductor structure is provided that controls the location and value of breakdown for various types of devices. In a first embodiment, a semiconductor is provided that comprises a substrate of a first type and having a surface. A source region is disposed in the substrate at the surface and is doped with dopant of a second type. A drain region is disposed in the substrate at the surface and doped with dopant of the second type, and a gate structure is disposed on the substrate between the source and drain regions. A breakdown region is disposed in the substrate below the drain region and is heavily doped with dopant of the first type to control the value and location of breakdown.

A method for making a semiconductor structure is provided in another embodiment. The method comprises forming a substrate of a first type, and implanting a first heavily doped breakdown region in the substrate with a dopant of the first type. A source region is implanted in the substrate with dopant of a second type, and a drain region is implanted in the substrate above the breakdown region with dopant of the second type. A gate structure is formed on the substrate between the source and drain regions.

A semiconductor structure that protects against latch-up is provided in another embodiment. The structure comprises a substrate of a first type, a source region disposed in the substrate and doped with dopant of a second type, and a drain region disposed in the substrate and doped with dopant of the second type. A gate structure is disposed on the substrate between the source and drain regions, and a breakdown region is disposed in the substrate below the source and drain regions. The breakdown region is heavily doped with dopant of the first type and coupled to a surface of the substrate with a heavily doped body contact region.

A bipolar semiconductor structure is provided in another embodiment of the invention. The structure comprises a substrate of a first dopant type; an emitter region disposed in the substrate and doped with a dopant of a second type; a base contact region disposed in the substrate and doped with dopant of the first type; and a collector region disposed in the substrate below and surrounding the emitter and base regions, heavily doped with dopant of the second type.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
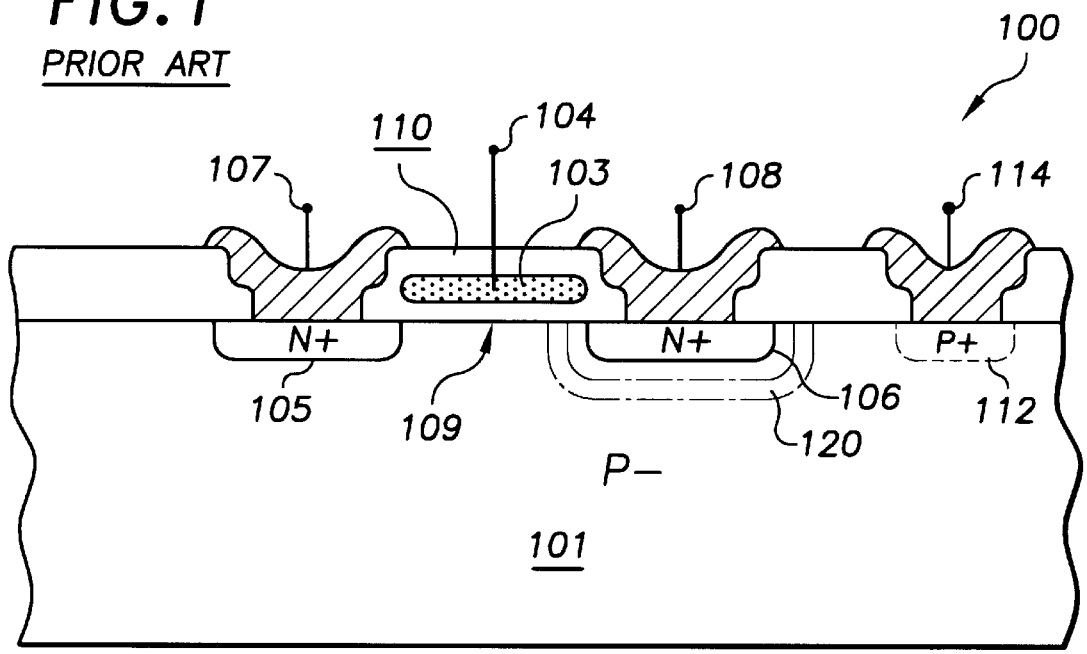
FIG. 1 illustrates a conventional n-channel MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to control breakdown for a number of semiconductor structures. The invention has been found to be particularly advantageous in applications where it is desirable to control breakdown in a MOS device in various technologies, such as for PMOS, NMOS, CMOS, or BiCMOS integrated circuits (ICs). While the present invention is not so limited, an appreciation of various aspects of the invention is best gained through a discussion of various application examples of processes used to form such semiconductor devices.

An example embodiment of the present invention uses a heavily doped buried region to control both the location of the breakdown and the value of the breakdown voltage that occurs in a MOSFET. The example structure provides a buried breakdown voltage that is less than the surface breakdown voltage, thereby controlling the location of the breakdown.

Figure 2:
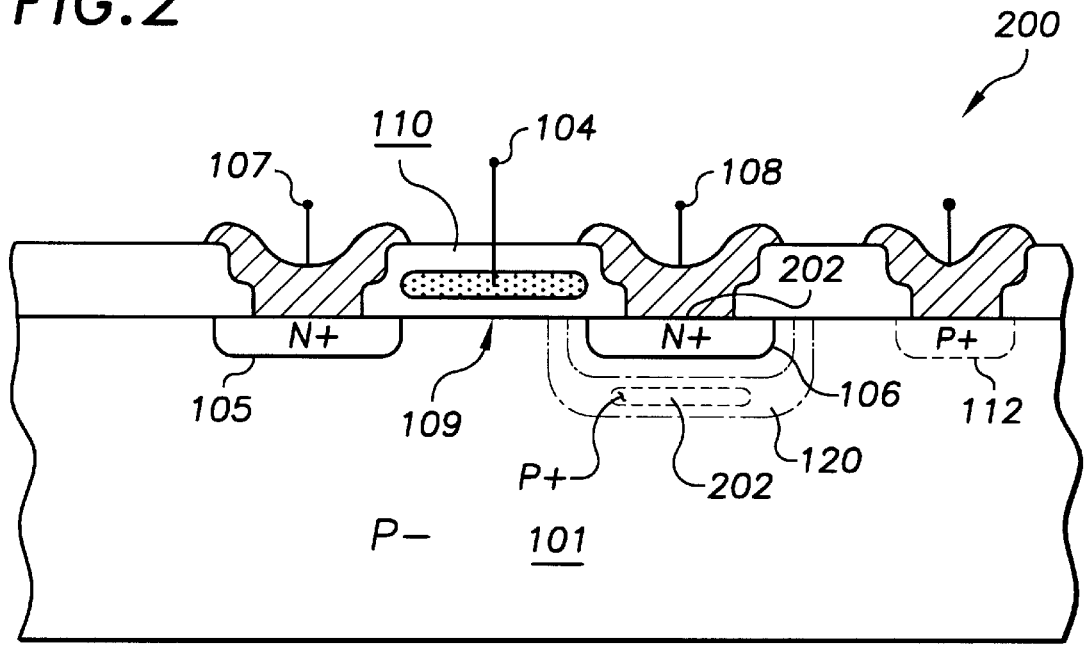
FIG. 2 is a cross-sectional view of an n-channel MOSFET structure according to a first example embodiment of the invention.

FIG. 2 is a cross-sectional view of a semiconductor structure according to a first example embodiment of the invention. The semiconductor structure 200 includes the features of the structure of FIG. 1, along with a $P^+$ region 202 below the $N^+$ drain region 106. If breakdown occurs, it will occur where the $P^+$ region 202 intersects the depletion region 120. It will be appreciated that if the dopant is implanted from the surface of the substrate 101 through the contact opening 204 of the drain, the implant is very controllable because of the precision provided by the contact opening and the energy of the implanted species. Furthermore, using the contact opening for implanting the buried heavily doped region 202 should not require an additional mask.

The buried $P^+$-doped region 202 causes the drain junction to go into breakdown at a voltage that is set by the distribution of the p-type dopant in the heavily doped $P^+$ region and its distance from the $N^+$-doped source diffusion. Breakdown is said to occur when significant current flows across a reverse biased junction. The use of ion implantation to introduce the p-type dopant provides control of both the amount of dopant introduced and its depth below the surface of the wafer. Because many $N^+$-doped drain regions are also formed by ion implantation, the vertical distance between the $N^+$-doped drain region 106 and the $P^+$-doped buried region 202 can be precisely controlled.

Figure 3:
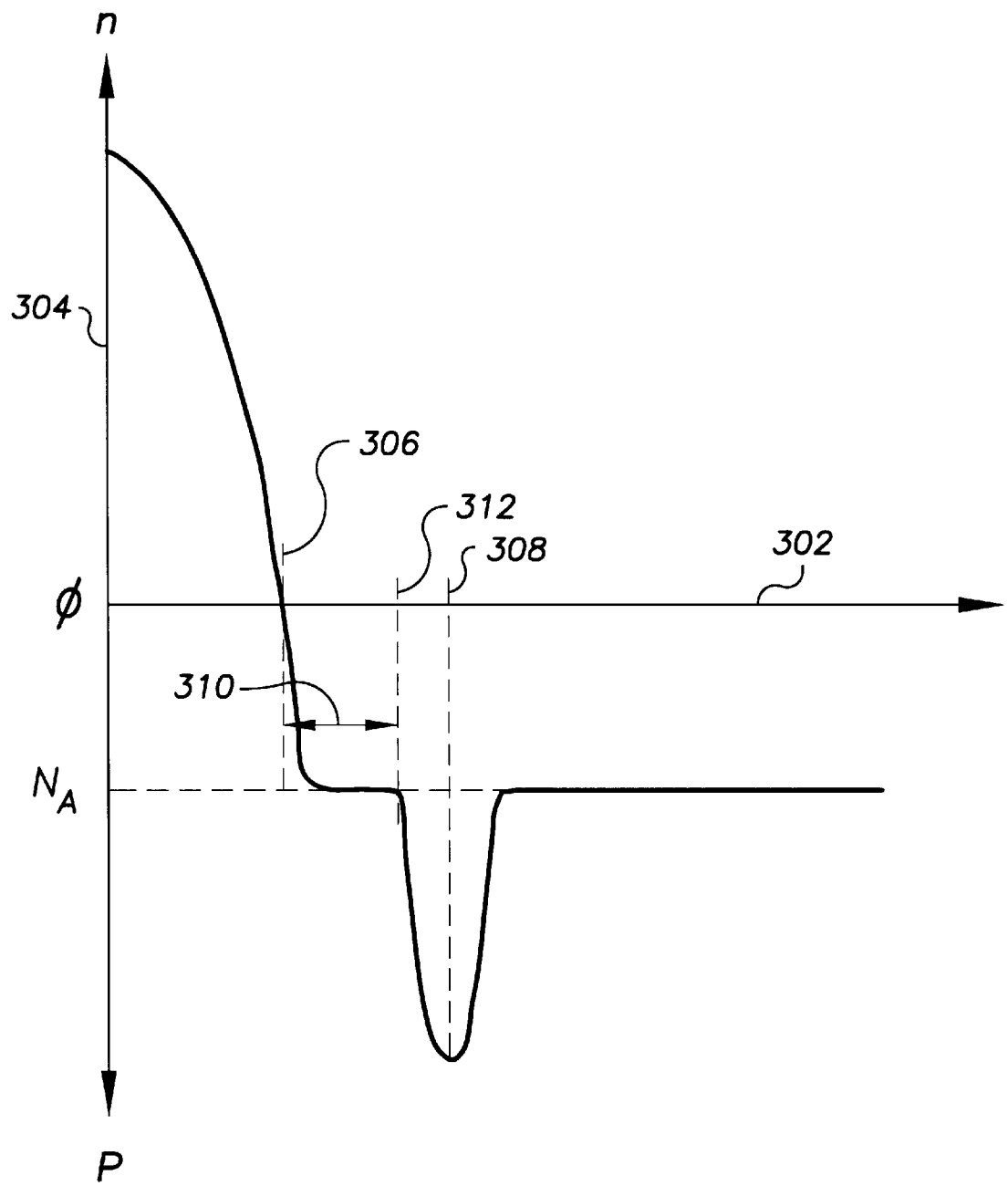
FIG. 3 shows the net dopant profile along a line perpendicular to the surface of the wafer of FIG. 2 through the drain diffusion.

FIG. 3 graphs the net dopant profile along a line perpendicular to the surface of the wafer 200 from the drain region 106 through the buried $P^+$ region 202. The horizontal axis 302 is the depth into the wafer and the vertical axis 304 is the dopant level.

The average junction depths of the $N^+$ regions 105 and 106 of the structure 200 of FIG. 2 are 0.35 microns, and the average depth of the $P^+$ region 202 is 1.0 microns. The average junction depth of the $N^+$ regions 106 is illustrated by dashed line 306, and the average depth of the peak of the $P^+$ region 202 is illustrated by line 308. The distance separating the $N^+$ region from the $P^+$ region may be approximately 0.5 microns. The separation between the $P^+$ region 202 and the $N^+$ region 106 is illustrated by the distance 310 between line 306 and the edge of the $P^+$ region, as shown by line 312. A depth of 1.5 microns for the center of the $P^+$ region 202 may be desirable to increase the separation between the $N^+$ region and the $P^+$ region. The example $P^+$ region 202 is formed from an implant of boron, for example, at approximately 300 keV to 1000 keV with an example dose range of approximately 5E12–1E15 ions/cm$^2$, and the $N^+$ regions 105 and 106 are formed from an implant of arsenic or phosphorus, for example, at approximately 20–100 keV with an example dose range of approximately 5E14–1E16 ions/cm$^2$. Comparatively, example materials, dose ranges, and implant energy ranges of the source and drain regions are arsenic or phosphorus, 20–100 keV, and 5E14–1E16 ions/cm$^2$.

Figure 4:
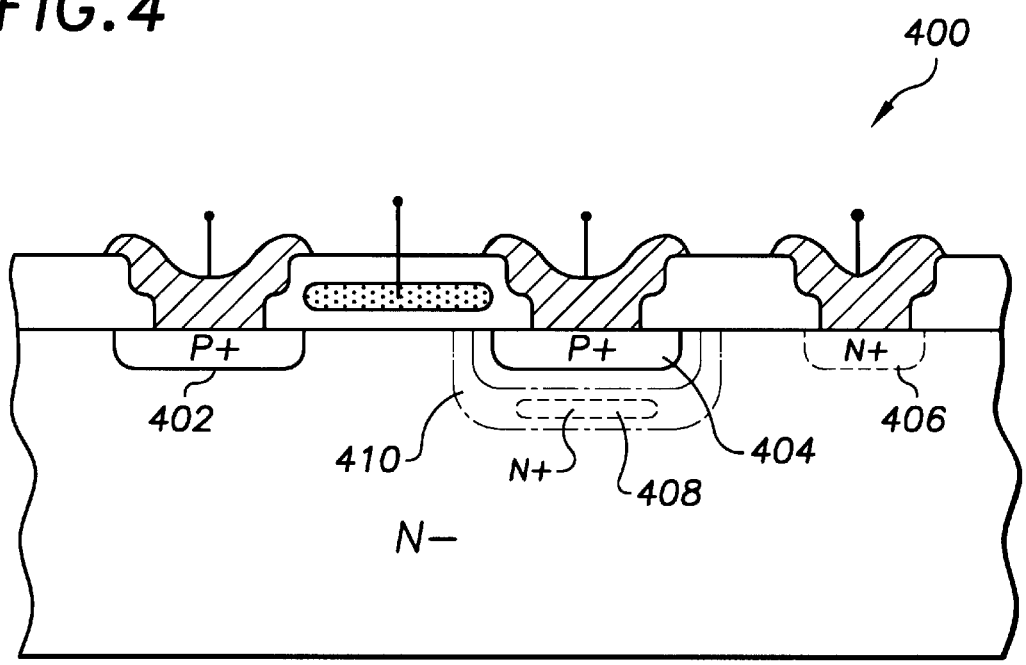
FIG. 4 is a cross-sectional view of a p-channel MOSFET semiconductor structure according to an example embodiment of the invention.

FIG. 4 is a cross-sectional view of a semiconductor structure according to a second example embodiment of the invention. Whereas the semiconductor structure 200 of FIG. 2 is a p-channel structure, the semiconductor structure 400 of FIG. 4 is an n-channel structure. The structure 400 includes heavily doped $P^+$ source and drain regions 402 and 404, and a heavily doped $N^+$ body contact region 406. A buried heavily doped $N^+$ region 408 is implanted below the drain region 404. If breakdown occurs, it will be where the $N^+$ region 408 overlaps with the depletion region 410. Dimensions that are comparable to the embodiment of FIG. 2 are also suitable for structure 400. The source and drain regions can be implanted with boron or indium, for example at approximately 10–100 keV with an example dose range of approximately 5E14–1E16 ions/cm$^2$. The example $N^+$ region 408 is formed from an implant of phosphorus, for example, at approximately 1000–6000 keV with an example dose range of approximately 5E12–1E15 ions/cm$^2$.

Figure 5:
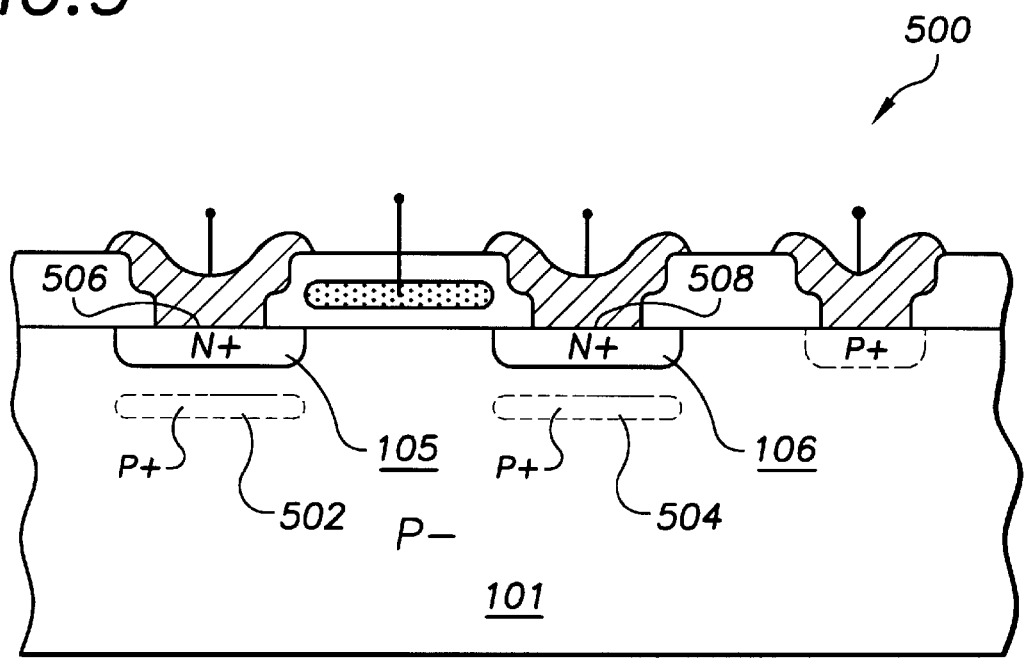
FIG. 5 is a cross-sectional view of an n-channel MOSFET structure according to another embodiment of the invention.

FIG. 5 is a cross-sectional view of a semiconductor structure according to another embodiment of the invention.

The structure 500 is an n-channel device that includes buried heavily doped P+ regions 502 and 504 below both the N+ source region 105 and the N+ drain region 106. The buried regions 502 and 504 protect both the source and drain regions 105 and 106 from high reverse voltages.

If breakdown occurs, it will occur beneath the reverse biased junction, which will typically be the drain. It will be appreciated that the dopant implant is very controllable if implanted from the surface of the substrate 101 through the contact openings 506 and 508 of the source and drain, respectively.

The average junction depths of the N+ regions 105 and 106 in the example structure of FIG. 5 are 0.35 microns, and the average depths of the center of the P+ regions 502 and 504 are 1.0 microns. The distance separating the N+ region from the P+ region may be approximately 0.5 microns. A depth of 1.5 microns for the region may be desirable to increase the separation between the N+ region and the P+ region. The example P+ regions 502 and 504 requires an implant at approximately 300 to 1000 keV with an example dose range of approximately 5E12–1E15 ions/cm$^2$.

Figure 6:
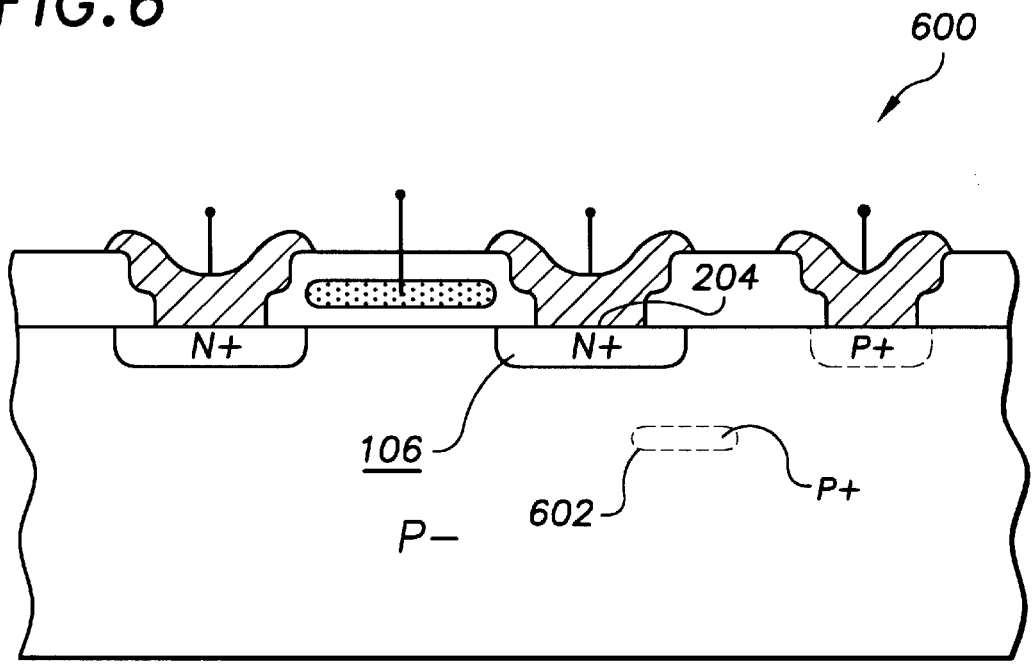
FIG. 6 is a cross-sectional view of another n-channel MOSFET structure according to an example embodiment of the invention.

FIG. 6 is a cross-sectional view of another semiconductor structure 600 according to an example embodiment of the invention. The basic source, gate, and drain structures of FIG. 6 are essentially the same as the corresponding structures of FIGS. 2 and 5. However, the structure 600 includes a buried P+ region 602 that is partially offset from alignment with the drain region 106. The embodiment may require a separate masking step as compared to the other embodiments because the buried P+ region 602 is slightly offset from the drain contact opening 204.

The structure 600, as compared to structure 200 of FIG. 2 has the effect of causing the breakdown to occur at a region away from the gate, thus reducing the likelihood that energetic carriers that exist in the breakdown region will reach the gate dielectric.

Example dimensions and techniques for making structure 600 are comparable to those set forth in the embodiments of FIGS. 2 and 5.

Figure 7:
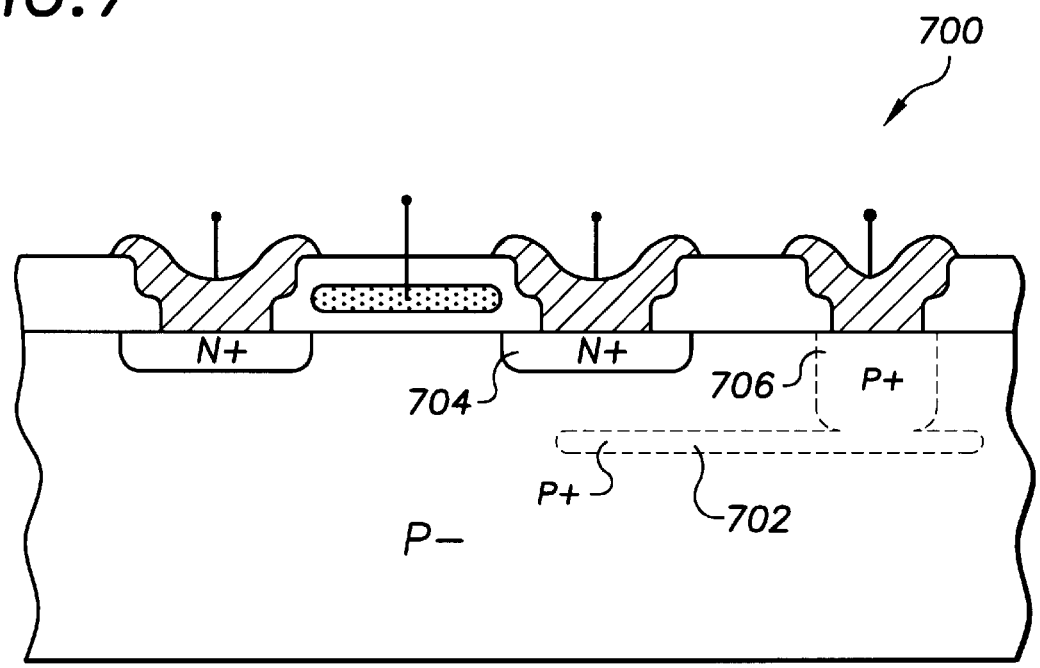
FIG. 7 is a cross-sectional view of a n-channel MOSFET structure having a heavily doped buried region below the drain region and coupled to a body structure of the semiconductor.

FIG. 7 is a cross-sectional view of a semiconductor structure 700 having a heavily doped buried P+ region 702 below the drain region 704 and coupled to a P+ body contact region 706 of the semiconductor structure 700.

The embodiment provides a low-resistance path between the drain region 704 and the heavily doped P+ region 702 for carrying current resulting from breakdown away from the transistor. This current carrying path may be desirable in a device where the transistor is coupled to an output pin of an integrated circuit and carries a relatively large current; any excess current may overheat the transistor. The body contact region 706 may, for example, be coupled to ground.

Depth, implant energy, and dosage level of the buried region 702 can be essentially the same as those stated for the embodiments of FIGS. 2, 5, and 6. The lateral dimensions of region 702 are a function of the separation between the drain region 704 and the body region 706.

Figure 8:
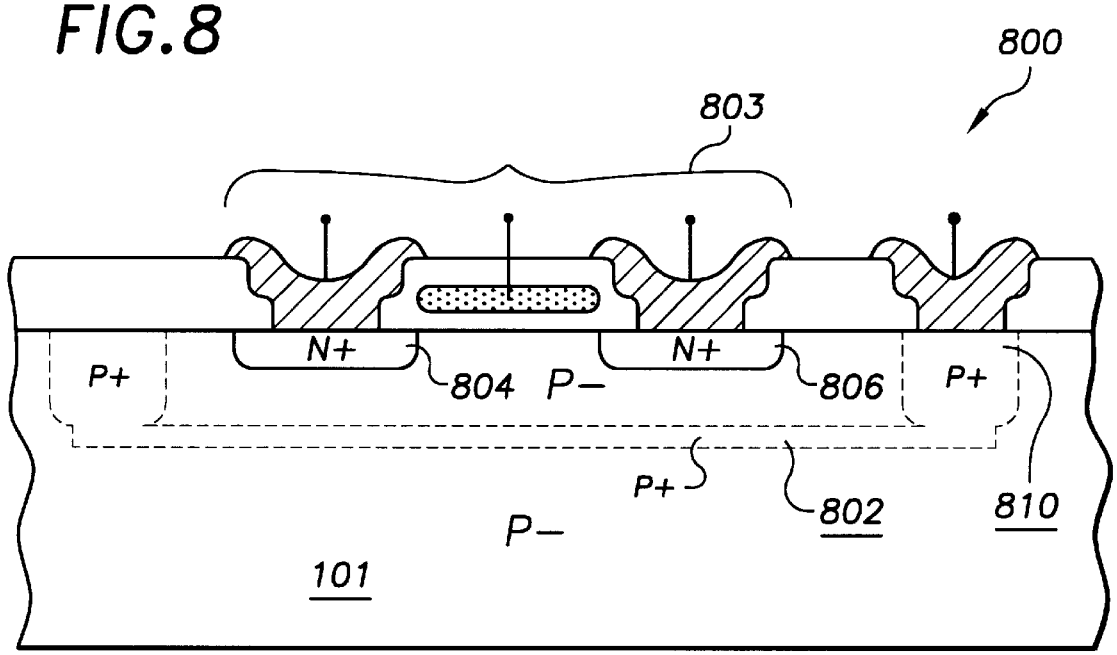
FIG. 8 is a cross-sectional view of an n-channel MOSFET structure having a buried, heavily doped $P^+$ region below and surrounding the transistor.

FIG. 8 is a cross-sectional view of an n-channel MOSFET structure 800 having a buried, heavily doped P+ region 802 below the transistor 803 and a heavily doped P+ region 810 that surrounds the transistor. Region 802 both controls breakdown as described above and also protects against latch-up when breakdown occurs.

When a device goes into breakdown, carriers result which may cause latch-up. Latch-up may occur, for example, when an n-channel device and a p-channel device are in close proximity, and one of the devices goes into breakdown. The carriers may travel to an adjacent device and cause latch-up Consistent with the example embodiment of the invention, latch-up is addressed by surrounding one of two adjacent n-channel and p-channel devices with a buried, heavily doped region. The buried region acts as a barrier to prevent carriers from moving outside the perimeter of the region to adjacent devices. Only one of a pair of adjacent n-channel and p-channel transistors requires a heavily doped, buried region as exemplified in FIG. 8. It will be appreciated that many n-channel devices may be surrounded by a single P+ buried layer 802 and heavily doped P+ region 810.

The heavily doped, buried P+ region 802 completely surrounds transistor 803 both below source and drain regions 804 and 806 and lateral to these regions. The P+ region 802 is also coupled to body contact region 810 which in turn is coupled to ground. Coupling the P+ region 802 to ground carries excess current caused by breakdown away from the structure 800, thereby protecting against latch-up in is an adjacent device.

The structure 800 can be made with generally the same methods described previously. However, it will be appreciated that additional masking is required to form the buried region 802 completely below the transistor.

Figure 9:
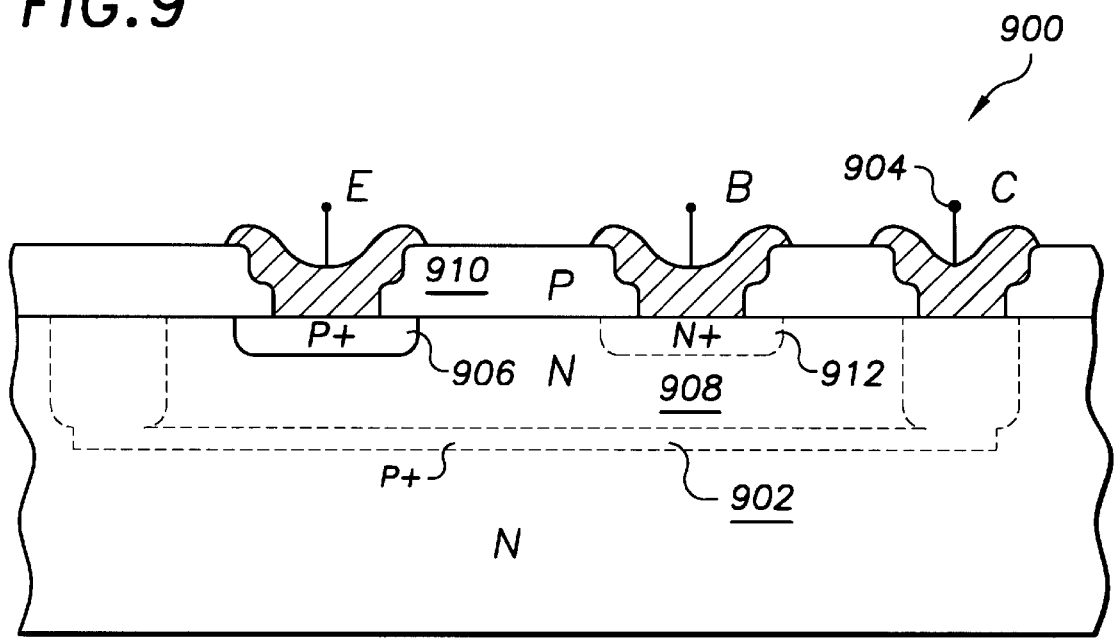
FIG. 9 is a cross-sectional view of an example semiconductor structure in which a heavily doped buried region is used to form a bipolar transistor.

FIG. 9 is a cross-sectional view of an example semiconductor structure 900 in which a heavily doped buried region 902 is used to form a bipolar transistor. The collector terminal 904 is coupled to ground for the example PNP transistor, the source diffusion region 906 is used as an emitter, and the body region 908 as the base of the transistor with the N+ base contact region 912. Region 910 is an oxide layer. The structure 900 can be made with generally the same methods described previously.

It will be appreciated that a bipolar NPN transistor can be formed in an alternate embodiment (not shown). For such an example embodiment, the buried layer 902 would be an N type region, region 908 would be a P type region, and region 910 would remain an oxide layer. Further, emitter region 906 would be N+, and base contact region 912 would be P+. For an NPN transistor, the collector terminal would be at N+.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

What is claimed is:

1. A semiconductor structure comprising:
    a substrate having a background dopant concentration of a first type;
    a source region disposed in the substrate and doped with dopant of a second type;
    a drain region disposed in the substrate and doped with dopant of the second type;
    a gate structure disposed on the substrate between the source and drain regions, wherein a channel region is formed in the substrate between the source and drain regions;
    a first breakdown region disposed in the substrate below the drain region and heavily doped with dopant of the first type, the first breakdown region having a first lateral boundary below the drain region and a second lateral boundary subjacent to the drain region, wherein the first breakdown region is separated from the drain region by a region of the substrate having a dopant concentration that is approximately equal to the background dopant concentration of the substrate; and a body contact region disposed in the substrate at the surface and doped with the first type dopant, wherein the first breakdown region extends laterally and is joined with the body contact region.

2. The structure of claim 1, wherein the first type of dopant is a p-type and the second type of dopant is an n-type.

3. The structure of claim 1, wherein the first type of dopant is an n-type and the second type of dopant is a p-type.

\* \* \* \* \*